US012666976B2

(12) United States Patent
Sato et al.

(10) Patent No.: US 12,666,976 B2
(45) Date of Patent: Jun. 23, 2026

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Katsuya Sato, Yokohama (JP); Tetsuya Yamamoto, Sagamihara (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 407 days.

(21) Appl. No.: 18/519,176

(22) Filed: Nov. 27, 2023

(65) Prior Publication Data

US 2024/0178107 A1 May 30, 2024

(30) Foreign Application Priority Data

Nov. 29, 2022 (JP) ................................. 2022-190073

(51) Int. Cl.
H10W 70/40 (2026.01)
H10W 90/00 (2026.01)

(52) U.S. Cl.
CPC ....... H10W 70/481 (2026.01); H10W 70/415 (2026.01); H10W 70/417 (2026.01); H10W 70/464 (2026.01); H10W 90/736 (2026.01)

(58) Field of Classification Search
None
See application file for complete search history.

(56) References Cited

U.S. PATENT DOCUMENTS

| | | | |
|---|---|---|---|
| 5,631,476 A | 5/1997 | Ferla et al. | |
| 5,851,855 A | 12/1998 | Ferla et al. | |
| 8,633,550 B2 | 1/2014 | Uno et al. | |
| 9,275,921 B2 | 3/2016 | Miyakawa | |
| 11,171,234 B2 | 11/2021 | Okawa et al. | |
| 11,715,795 B2 | 8/2023 | Okawa et al. | |
| 2004/0232545 A1* | 11/2004 | Takaishi .............. | H10W 74/111 |
| | | | 257/E23.092 |

(Continued)

FOREIGN PATENT DOCUMENTS

| | | |
|---|---|---|
| JP | 2987088 B2 | 12/1999 |
| JP | 2012-146998 A | 8/2012 |

(Continued)

*Primary Examiner* — Bilkis Jahan
(74) *Attorney, Agent, or Firm* — Oblon, McClelland, Maier & Neustadt, L.L.P.

(57) ABSTRACT

According to an embodiment, a semiconductor device includes a first electrode, a second electrode, a semiconductor chip, and a third electrode. The second electrode includes a plurality of terminals, and one slit. The one slit is formed between adjacent two out of the plurality of terminals. The semiconductor chip includes a first face and a second face. The first face is connected to the first electrode via a joining material. The second face is opposite the first face and connected to the second electrode via a joining material. The third electrode is connected to the second face via a joining material, inside the slit provided in the second electrode.

5 Claims, 5 Drawing Sheets

(56)     References Cited

U.S. PATENT DOCUMENTS

| 2006/0091512 | A1* | 5/2006 | Shinohara | H10W 72/00 257/E23.044 |
| 2014/0332951 | A1* | 11/2014 | Nakamura | H10W 40/258 257/712 |
| 2016/0233150 | A1* | 8/2016 | Fukui | H10W 70/481 |
| 2021/0287971 | A1* | 9/2021 | Hara | H10W 70/481 |
| 2021/0351161 | A1* | 11/2021 | Iguchi | H10W 76/47 |

FOREIGN PATENT DOCUMENTS

| JP | 5706251 | B2 | 4/2015 |
| JP | 2015-142072 | A | 8/2015 |
| JP | 6775872 | B1 | 10/2020 |

* cited by examiner

SEMICONDUCTOR DEVICE

CROSS-REFERENCE TO RELATED APPLICATIONS

This application is based upon and claims the benefit of priority from Japanese Patent Application No. 2022-190073, filed on Nov. 29, 2022; the entire contents of which are incorporated herein by reference.

FIELD

Embodiments of the present invention relate generally to a semiconductor device.

BACKGROUND

Conventionally, in a semiconductor package including gate, source, and drain terminals, a plurality of the source terminals are adjacent to each other in parallel, and the gate terminal is positioned in a region on the outer periphery side of a semiconductor chip.

DETAILED DESCRIPTION

According to an embodiment, a semiconductor device includes a first electrode, a second electrode, a semiconductor chip, and a third electrode. The second electrode includes a plurality of terminals, and one slit. The one slit is formed between adjacent two out of the plurality of terminals. The semiconductor chip includes a first face and a second face. The first face is connected to the first electrode via a joining material. The second face is opposite the first face and connected to the second electrode via a joining material. The third electrode is connected to the second face via a joining material, inside the slit provided in the second electrode.

Figure 1:
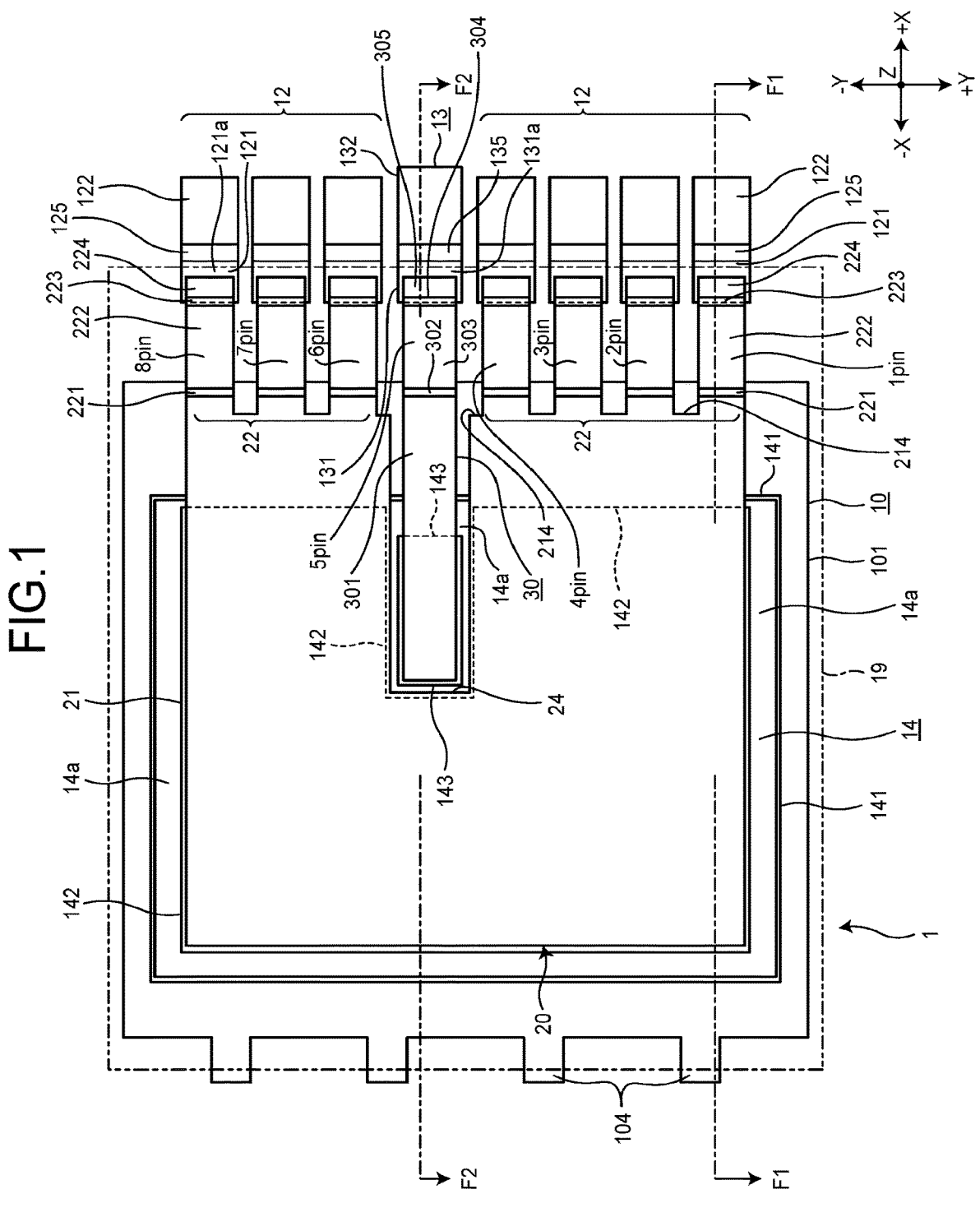
FIG. 1 is a plan view of a semiconductor device according to an embodiment.
Figure 2:
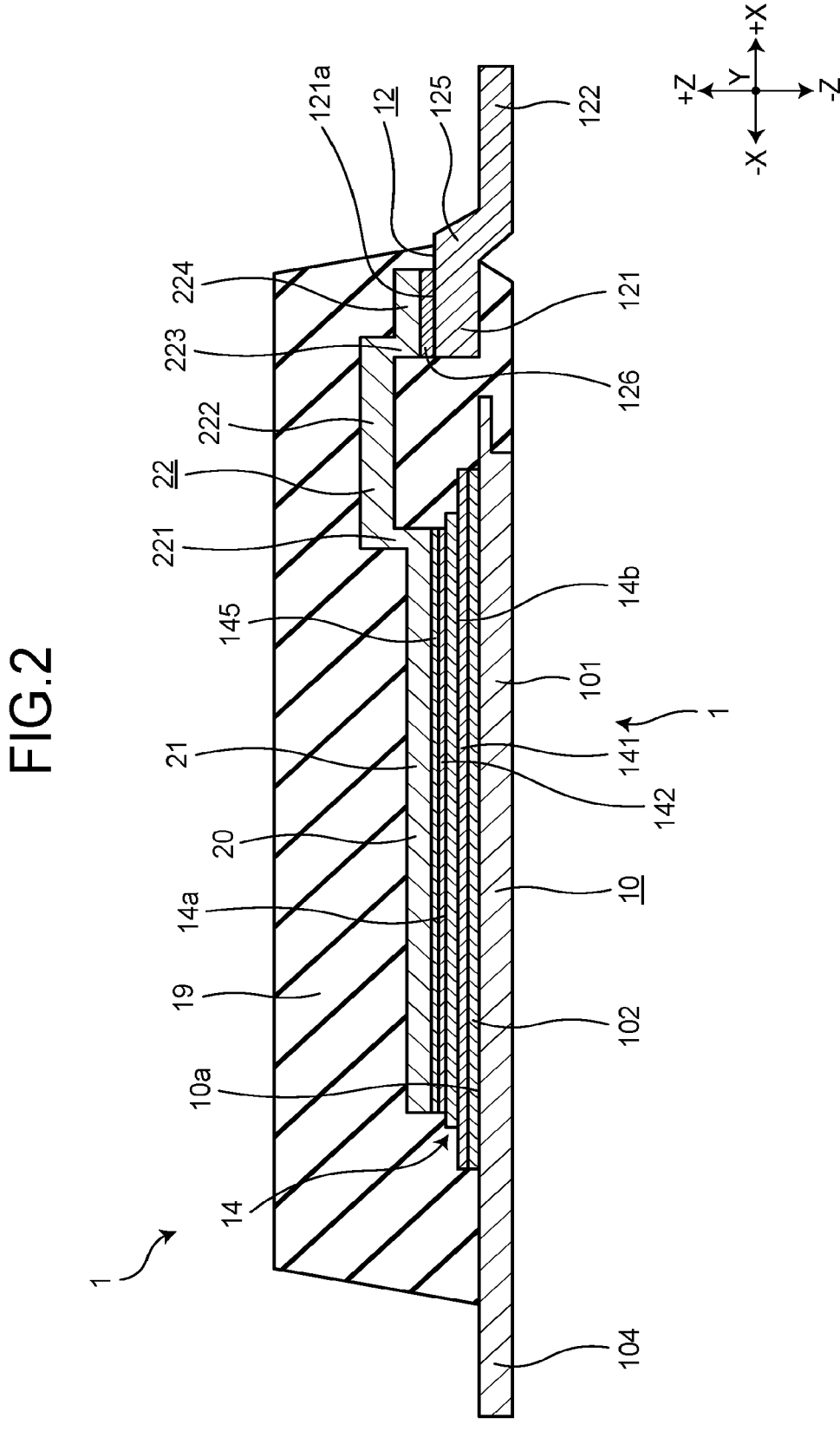
FIG. 2 is a cross-sectional view illustrating a first electrode and a second electrode of the semiconductor device according to the embodiment.
Figure 3:
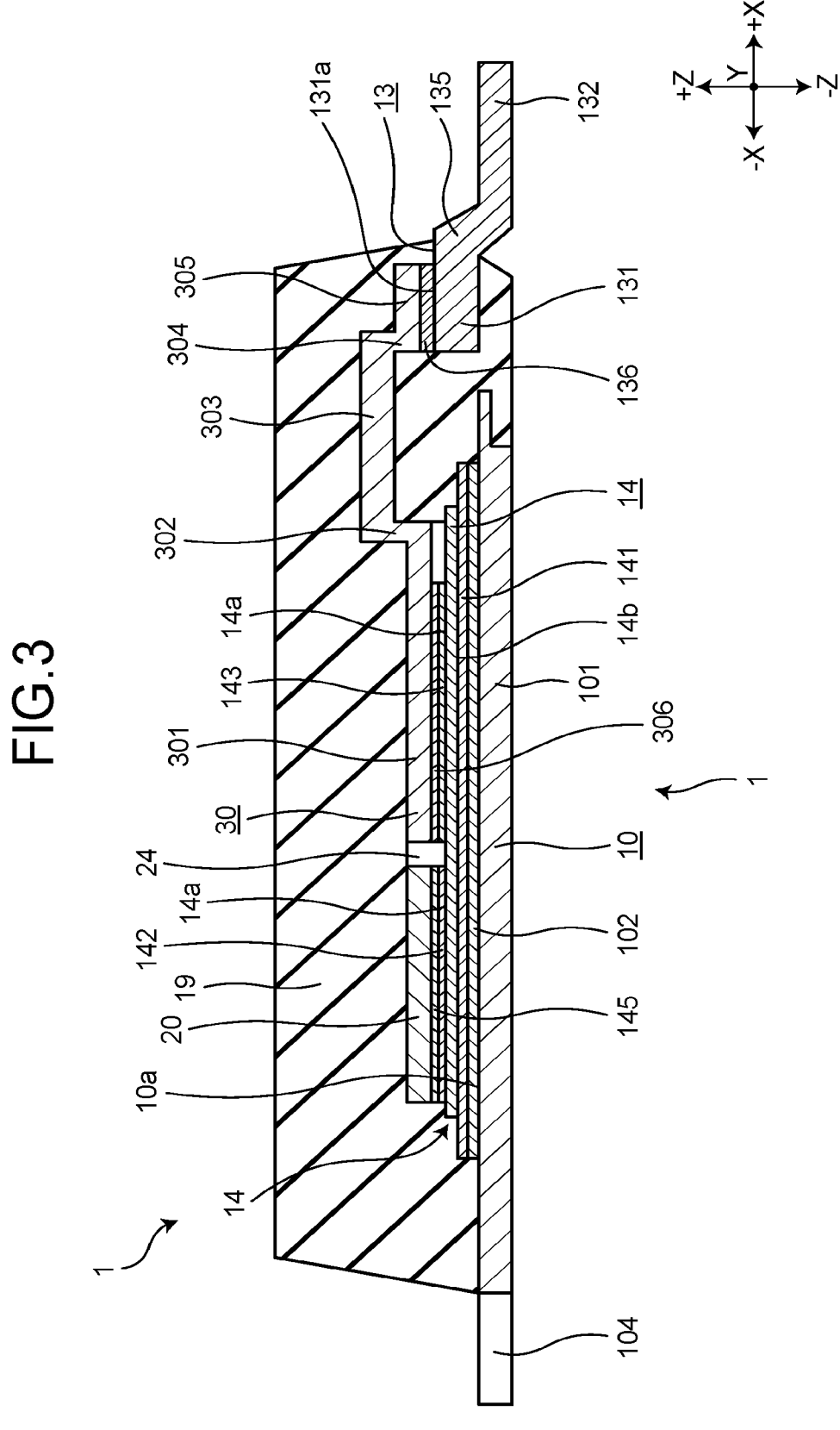
FIG. 3 is a cross-sectional view illustrating a third electrode and a slit of the semiconductor device according to the embodiment.

As outlined in FIGS. 1 to 3, a semiconductor device 1 according to the present embodiment includes a first electrode 10, a second electrode 20 serving as, for example, a source connector, a third electrode 30 serving as, for example, a gate connector, a first lead frame 12, a second lead frame 13, a semiconductor chip 14 including the electrodes, and a sealant 19 for protecting the semiconductor chip 14. Note that, to make the structure of the semiconductor device 1 easier to understand, the sealant 19 is illustrated in a dash-dot-dot line in FIG. 1. The entirety of the semiconductor device 1 is mounted on a package substrate not illustrated. FIG. 2 is a cross-sectional view of a part of the semiconductor device 1, taken along line F1-F1 in FIG. 1. FIG. 3 is a cross-sectional view of a part of the semiconductor device 1, taken along line F2-F2 in FIG. 1.

In the following description, an X-Y-Z Cartesian coordinate system is used. The X-axis direction includes the +X direction and the −X direction. The Y-axis direction includes the +Y direction and the −Y direction. The Z-axis direction includes the +Z direction and the −Z direction. A direction from the first electrode 10 toward the semiconductor chip 14 illustrated in FIG. 2 is taken as an upward direction (the +Z direction). A direction opposite to the upward direction is taken as a downward direction (the −Z direction). A direction from the second electrode 20 toward the first lead frame 12 in an XY-plane (in a horizontal plane) illustrated in FIG. 1 is taken as the +X direction, meanwhile a direction opposite to the +X direction is taken as the −X direction.

In the present embodiment, the semiconductor chip 14 illustrated in FIG. 1, which has, for example, a rectangular plate shape of several millimeters square in a plan view, is, although not limited to, a metal-oxide-semiconductor field effect transistor (MOSFET) formed using silicon as a base material. That is, the semiconductor chip 14 may be, for example, a vertical insulated gate bipolar transistor (IGBT), a vertical diode, or another type of semiconductor chip. The semiconductor chip 14 may be formed using a compound other than silicon, such as SiC or GaN, as a base material.

The first electrode 10 is formed of a conductive material such as copper, and includes, for example, a rectangular plate-shaped die pad 101 and a plurality of leads 104 (four leads in the example illustrated in FIG. 1) protruding from the die pad 101 in the −X direction. The first electrode 10 is formed, for example, by pressing, and the die pad 101 and the leads 104 are integrated.

As illustrated in FIG. 2, a conductive joining material 102 such as solder is provided between a first face 14b, which is a lower face of the semiconductor chip 14, and an upper face 10a of the first electrode 10, and the semiconductor chip 14 and the first electrode 10 are joined together by the joining material 102.

As illustrated in FIGS. 1 to 3, the semiconductor chip 14 includes a drain electrode 141, a source electrode 142, and a gate electrode 143. As illustrated in FIG. 2, the source electrode 142 is disposed on a second face 14a, which is opposite the first face 14b and is an upper face of the semiconductor chip 14. The gate electrode 143 illustrated in FIG. 1 and FIG. 3 is disposed on the second face 14a of the semiconductor chip 14 so as to be separated from the source electrode 142 in the horizontal plane. The drain electrode 141 is formed on most of the first face 14b of the semiconductor chip 14. Furthermore, the drain electrode 141 is electrically connected to the first electrode 10 via the joining material 102.

The second electrode 20 illustrated in FIG. 1 electrically connects the source electrode 142 formed on the second face 14a of the semiconductor chip 14 to a plurality of the first lead frames 12. The second electrode 20 is formed of a conductive material such as copper. The second electrode 20 includes: a plate base 21, which has a substantially rectangular plate shape in a plan view; a plurality of terminals 22 (seven terminals in the example illustrated in FIG. 1) formed at an edge 214 on the +X direction side of the plate base 21 and extending outward from the plate base 21; and one slit 24 formed by cutting off, for example, a rectangular piece out of the plate base 21 from the edge 214 of the plate base 21 between the terminals 22 adjacent in the Y-axis direction to each other, inside the plate base 21. For example, the direction of extension of the terminals 22 (the X-axis direction) is parallel to the direction of extension of the slit 24.

As illustrated in FIG. 1, the source electrode 142 is formed in such a manner that a part of the source electrode 142, the part corresponding to the slit 24, is cut off, whereby the source electrode 142 is not included inside the slit 24. Therefore, the second face 14a of the semiconductor chip 14 is exposed inside the slit 24. As illustrated in FIG. 1 and FIG. 3, the source electrode 142 and the gate electrode 143 disposed inside the slit 24 are separated from each other in the XY-plane.

As illustrated in FIG. 1, the seven terminals 22 aligned along the Y-axis direction are spaced evenly along the Y-axis direction, except, for example, a space between the fourth terminal 22 (4-pin terminal 22) when viewed from the +Y direction side and the sixth terminal 22 (6-pin terminal 22) adjacent to the fourth terminal 22. Note that, in FIG. 1, the terminals 22 aligned from the +Y direction side toward the −Y direction side and the third electrode 30 are numbered. That is, the terminal 22 positioned on the most +Y direction side is numbered 1-pin, and the remaining terminals 22 are consecutively numbered 2-pin, 3-pin, and the like toward the −Y direction side. Furthermore, the third electrode 30, which is the fifth when viewed from the +Y direction side, is numbered 5-pin. The terminal 22 positioned on the most −Y direction side is numbered 8-pin.

For example, as illustrated in FIG. 1 and FIG. 2, each of the terminals 22 of the second electrode 20 includes a first extension 221, a second extension 222, a third extension 223, and a fourth extension 224. The first extension 221 extends to rise from one edge on the +X direction side of the plate base 21 toward the +Z direction.

The second extension 222 is connected to the first extension 221 and extends in the +X direction. The second extension 222 is positioned above the plate base 21. The third extension 223 is connected to the second extension 222 and extends substantially in the −Z direction. The fourth extension 224 is connected to the third extension 223 and extends in the +X direction.

As illustrated in FIG. 2, a conductive joining material 145 such as solder is disposed between the lower face of the plate base 21 and the source electrode 142, whereby the second electrode 20 and the source electrode 142 of the semiconductor chip 14 are joined together by the joining material 145.

As illustrated in FIG. 1, the slit 24 is formed, for example, in a rectangular shape extending along the X-axis direction so as to match the shape of the slit 24 to the rectangular shape in the plan view of the third electrode 30 extending parallel to the terminals 22 of the second electrode 20. Note that the shape of the slit 24 is not limited to the illustrated example. That is, the slit 24 is formed by cutting off a piece out of the plate base 21 to match the shape of the slit 24 to the third electrode 30.

The size of the slit 24 illustrated in FIG. 1 and FIG. 3 is set at least to secure a gap so that the third electrode 30 disposed inside the slit 24 and the plate base 21 and the terminals 22 of the second electrode 20 are prevented from coming into contact with each other and resulting in short circuit. Besides this gap, in consideration of the spread, during a reflow process, of a joining material 306 such as solder illustrated in FIG. 3 for joining the third electrode 30 to the gate electrode 143 and the spread, during a reflow process, of the joining material 145 such as solder illustrated in FIG. 2 for joining the second electrode 20 to the source electrode 142, a margin may be set to prevent the joining material 306 and the joining material 145 from coming into contact with each other.

The first lead frames 12, each of which is connected on a one-to-one basis to a corresponding one of the terminals 22 of the second electrode 20 illustrated in FIG. 1 and FIG. 2, are formed of a conductive material such as copper. As illustrated in FIG. 1 and FIG. 2, the first lead frames 12 are separated from the first electrode 10 along the X-axis direction. The first lead frames 12 each include, for example, a flat plate portion 121, a slope portion 125, and a first extension 122. An upper face 121a of the flat plate portion 121 is positioned, for example, above the second face 14a of the semiconductor chip 14. The upper face 121a of the flat plate portion 121 is, for example, parallel to the XY-plane. For example, a conductive joining material 126 such as solder is disposed on the upper face 121a of the flat plate portion 121, and the lower face of the fourth extension 224 of the terminal 22 and the upper face 121a of the flat plate portion 121 are joined together by the joining material 126.

As illustrated in FIG. 1 and FIG. 2, the first extension 122 is connected to the flat plate portion 121 via the slope portion 125 and extends in the +X direction. The first extension 122 is positioned below the flat plate portion 121. Hence, the slope portion 125 extends obliquely downward toward the +X direction side.

For example, the seven terminals 22 illustrated in FIG. 1 are all of uniform length in the X-axis direction, but the terminals 22 may be different in length from each other. The second electrode 20 has a structure in which the terminals 22 extend from the plate base 21, whereby a stress on the second electrode 20 during the joining of the terminals 22 to the first lead frames 12 in the reflow process can be dispersed on the terminal 22 side, so that solder joining of the terminals 22 to the first lead frames 12 can be properly performed. Therefore, compared to the case where the second electrode 20 is, for example, a single plate without a plurality of terminals, the occurrence of a failure in joining of the second electrode 20 to the first lead frames 12 after the reflow process can be substantially prevented.

In the present embodiment, the terminals 22 of the second electrode 20 and the first lead frames 12 are joined together by the joining material 126. However, the joining material 126 may not be used for the joining of the first lead frames 12 to the terminals 22 illustrated in FIG. 2, and the first lead frames 12 and the terminals 22 may be integrated in advance, and each of the first lead frames 12 itself may be a part of a corresponding one of the terminals 22 of the second electrode 20 in advance. Alternatively, the terminals 22 and the first lead frames 12 may be joined using bonding wire.

The third electrode 30 illustrated in FIG. 1 and FIG. 3 and disposed inside the slit 24 includes, for example, a first extension 301, a second extension 302, a third extension 303, a fourth extension 304, and a fifth extension 305. The first extension 301 is connected to the gate electrode 143.

As illustrated in FIG. 3, a conductive joining material 306 such as solder is interposed between the lower face of the first extension 301 and the gate electrode 143, so that the first extension 301 and the gate electrode 143 are joined together by the joining material 306. As illustrated in FIG. 1 and FIG. 3, the third electrode 30 and the second electrode 20 are horizontally separated from each other. A current flowing between the source electrode 142 and the drain electrode 141 is controlled in accordance with a voltage applied to the gate electrode 143.

As illustrated in FIG. 3, the second extension 302 is connected to the first extension 301 and extends to rise in the +Z direction. The third extension 303 is connected to the second extension 302, is positioned above the first extension 301, and extends in the +X direction. The fourth extension 304 is connected to the third extension 303 and extends substantially in the −Z direction. The fifth extension 305 is connected to the fourth extension 304 and extends in the +X direction.

The second lead frame 13 illustrated in FIG. 1 and FIG. 3 and connected to the third electrode 30 is formed of a conductive material such as copper. The second lead frame 13 is separated from the first electrode 10 along the X-axis direction. In the present embodiment, the second lead frame 13 includes a flat plate portion 131, a slope portion 135, and a first extension 132. As illustrated in FIG. 3, an upper face 131a of the flat plate portion 131 is positioned, for example, above the second face 14a of the semiconductor chip 14. The upper face 131a of the flat plate portion 131 is, for example, parallel to the XY-plane.

For example, a conductive joining material 136 such as solder is disposed on the upper face 131a of the flat plate portion 131, whereby the lower face of the fifth extension 305 of the third electrode 30 and the upper face 131a of the flat plate portion 131 of the second lead frame 13 are joined together by the joining material 136. Note that the joining material 136 may not be used for the joining of the second lead frame 13 to the third electrode 30, and the second lead frame 13 and the third electrode 30 may be integrated in advance. Alternatively, the third electrode 30 and the second lead frame 13 may be joined together using bonding wire.

In the semiconductor device 1 according to the present embodiment, as illustrated in FIG. 1, the number of the terminals 22 of the second electrode 20 is odd, namely seven, and the slit 24 is formed between the 4-pin terminal 22 and the 6-pin terminal 22 when viewed from the +Y direction side, for example. Therefore, the number of the terminals 22 disposed on one direction side (the −Y direction side) of the alignment direction (the Y-axis direction) of the terminals 22 separated from the slit 24 is three, which is less by one than the number of the terminals 22, namely four, separated from the slit 24 on another direction side (+Y direction side) opposite to the one direction side. Therefore, the slit 24 and the third electrode 30 disposed inside the slit 24 are positioned adjacent on the −Y direction side to the central 4-pin terminal 22 out of the seven terminals 22 aligned.

Figure 4:
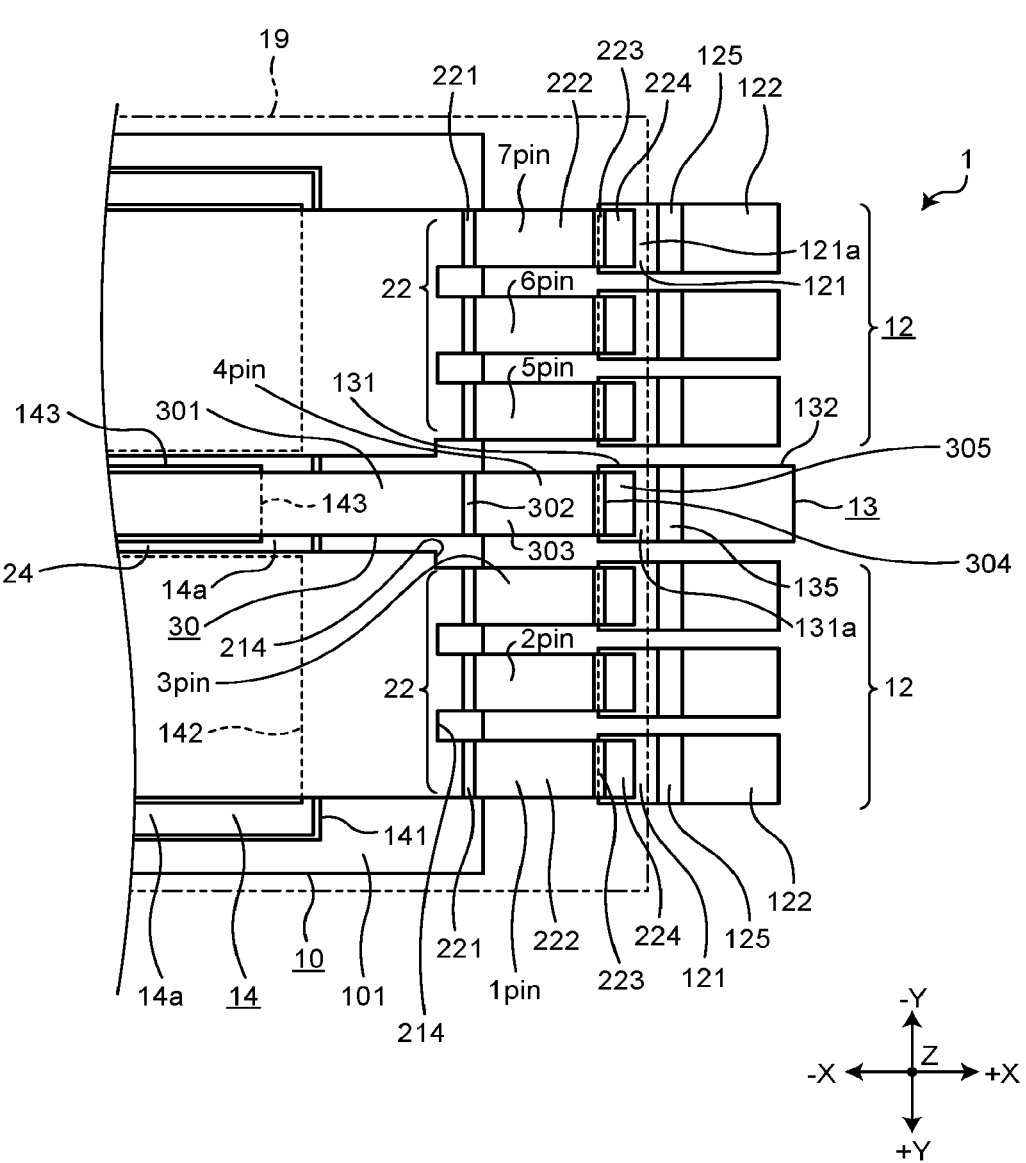
FIG. 4 is a plan view illustrating a part of a semiconductor device according to a modification of the embodiment, in which the number of terminals of a second electrode is even (six)

For example, as illustrated in FIG. 4, the number of the terminals 22 extending from the plate base 21 in the semiconductor device 1 may be even (for example, six). Then, the slit 24 is formed, for example, between the 3-pin terminal 22 and the 5-pin terminal 22 when viewed from the +Y direction side. Hence, the number of the terminals 22 disposed on one direction side (the −Y direction side) of the alignment direction (the Y-axis direction) of the terminals 22 separated from the slit 24 is three, meanwhile the number of the terminals 22 separated from the slit 24 on another direction side (the +Y direction side) opposite to the one direction side is the same number, namely three. The slit 24 and the third electrode 30 disposed inside the slit 24 and serving as a 4-pin are positioned at the center in the alignment direction (the Y-axis direction) of the terminals 22.

As illustrated in FIG. 1 to FIG. 3, the sealant 19 is formed in a substantially rectangular parallelepiped shape in the present embodiment. However, the shape of the sealant 19 is not limited to this example. The sealant 19 seals a joint between the first electrode 10 and the semiconductor chip 14, a joint between the gate electrode 143 and the third electrode 30, a joint between the third electrode 30 and the second lead frame 13, a joint between the source electrode 142 and the second electrode 20, and a joint between each of the terminals 22 of the second electrode 20 and a corresponding one of the first lead frames 12.

Specifically, the sealant 19 covers the upper and the side faces of a die pad 101 and a part of the lead 104 of the first electrode 10. Furthermore, the sealant 19 covers a part of the flat plate portion 121 of each of the first lead frames 12, for example. Furthermore, the sealant 19 covers a part of the flat plate portion 131 of the second lead frame 13, for example.

The sealant 19 causes a part of the first electrode 10, a part of each of the first lead frames 12, and a part of the second lead frame 13 to be exposed. Specifically, the sealant 19 causes the lower face of the first electrode 10 and the remaining part of the lead 104 to be exposed. The sealant 19 causes the remaining part of the flat plate portion 121, the slope portion 125, and the first extension 122 of each of the first lead frames 12 to be exposed. Furthermore, the sealant 19 causes the remaining part of the flat plate portion 131, the slope portion 135, and the first extension 132 of the second lead frame 13 to be exposed.

During the use of the semiconductor device 1, the lower face of the first electrode 10, the lead 104 of the first electrode 10, the first extension 122 of each of the first lead frames 12, and the first extension 132 of the second lead frame 13 are electrically connected to external wiring. However, the part of the first electrode 10, the part of each of the first lead frames 12, and the part of second lead frame 13, which are exposed from the sealant 19, are not limited to the above-mentioned example.

Hereinafter, effects of the semiconductor device 1 according to the present embodiment will be described. To confirm the effects of the semiconductor device 1, a power cycle test was conducted as described below. A gate voltage is applied to the semiconductor device 1 from a power supply, not illustrated, to form a channel region, and a drain current (a rated current) was passed between the source electrode 142 and the drain electrode 141 for approximately 1.2 seconds as the ON time, meanwhile the OFF time was set at approximately 10 seconds. Note that, in the power cycle test, the test current (the drain current) was set at, for example, 400 amperes, but can be suitably selected within a range of tens to hundreds of amperes, and the ratio of the ON time to the OFF time can be changed as needed.

The on-off switching of the semiconductor device 1 caused the semiconductor device 1 to be repeatedly heated and cooled. Here, heat generation in the third electrode 30 serving as a gate connector and configured to control the on-off state of the semiconductor chip 14 is caused by slightly transferring heat generated by the semiconductor chip 14, and the amount of heat generated by the third electrode 30 itself configured to perform the on-off control only is very small. In contrast, the amount of heat generated by the second electrode 20 serving as a source connector is much higher than the amount of heat generated by the third electrode 30 because of, in addition to the transfer of heat generated by the semiconductor chip 14, the passage of a drain current through the plate base 21 itself and the terminals 22 themselves of the second electrode 20.

To make a comparison with the power cycle test for the semiconductor device 1 according to the present embodiment, a semiconductor device for a comparative test was prepared in which the third electrode 30 serving as a gate connector is disposed at a position of the 1-pin illustrated in FIG. 1 (a position on the most +Y direction side), the terminals 22 serving as source connectors are disposed at positions of the 2-pin to the 8-pin, respectively, and the third electrode 30 is not sandwiched by the terminals 22 of the second electrode 20. The semiconductor device for the comparative test was also subjected to a power cycle test under the same conditions as described above.

Figure 5:
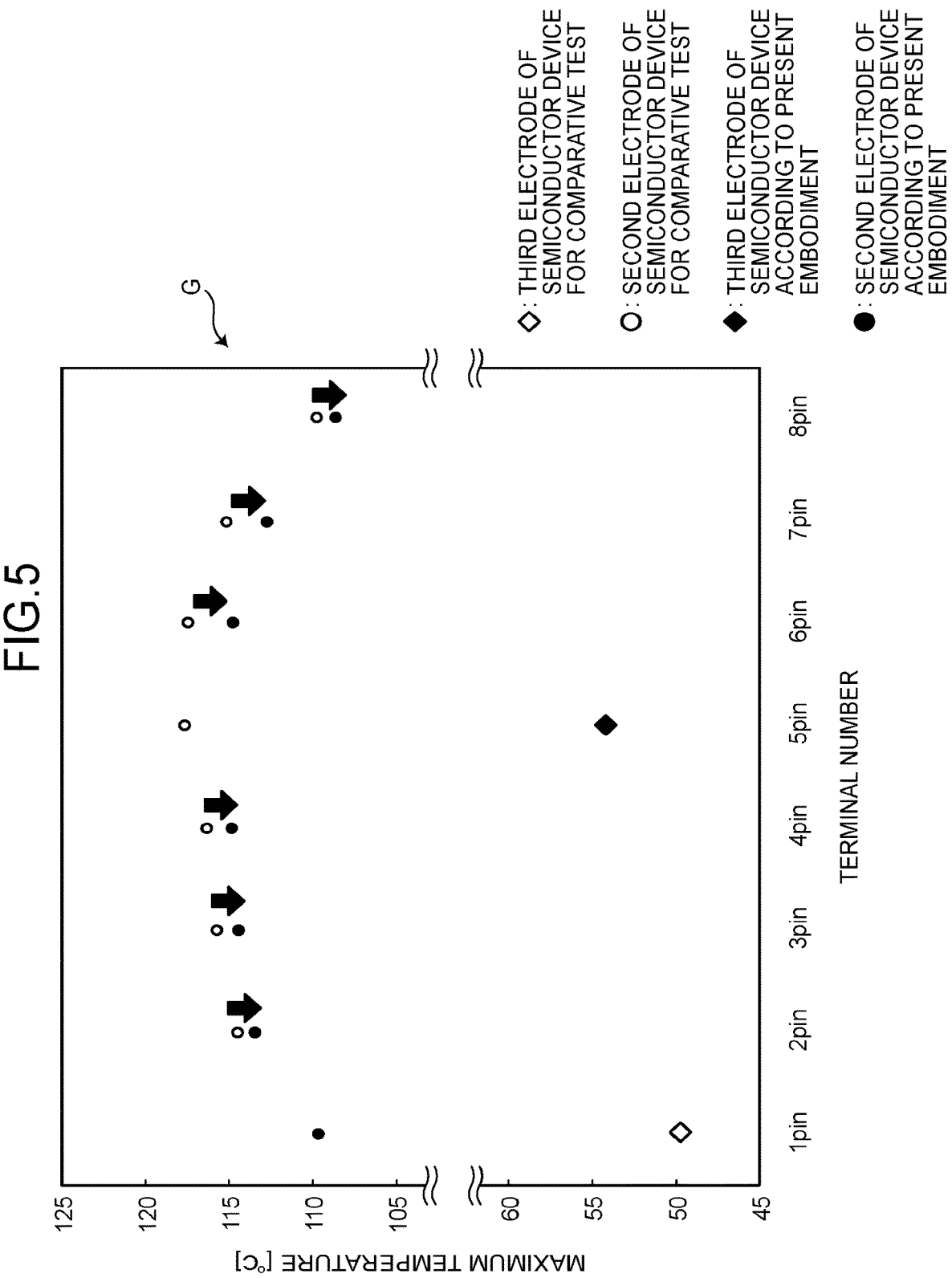
FIG. 5 is a diagram illustrating the temperature distribution of a plurality of terminals of the second electrode and the third electrode of the semiconductor device in a power cycle test.

The temperature distribution of the terminals 22 of the second electrode 20 and the third electrode 30 of the semiconductor device 1 in the above-mentioned power cycle test and the temperature distribution of the terminals 22 of the second electrode 20 and the third electrode 30 of the semiconductor device for the comparative test were evaluated using a thermoviewer installed, for example, in an upper portion of the semiconductor device 1. The results of the evaluation are illustrated using a temperature distribution diagram G in FIG. 5.

In the temperature distribution diagram G, the horizontal axis represents the (pin) number of the terminals 22 and the third electrode 30, and the vertical axis represents the maximum temperatures (° C.) of the terminals 22 and the third electrode 30. Furthermore, in the temperature distribution diagram G, an open square ($\diamond$) represents the third electrode 30 of the semiconductor device for the comparative test, an open circle (o) represents the terminal 22 of the semiconductor device for the comparative test, a solid square ($\blacklozenge$) represents the third electrode 30 of the semiconductor device 1 according to the present embodiment, and a solid circle ($\bullet$) represents the terminal 22 of the semiconductor device 1 according to the present embodiment.

As illustrated in the temperature distribution diagram G, in the structure of the semiconductor device for the comparative test, that is, a structure in which the third electrode 30 serving as a gate connector was disposed at a position of the 1-pin illustrated in FIG. 1 (a position on the most +Y direction side), the terminals 22 of the second electrode 20 serving as source connectors were disposed at positions of the 2-pin to the 8-pin, respectively, and the third electrode 30 was not sandwiched between the terminals 22 of the second electrode 20, the maximum temperature of the third electrode 30 was approximately 50° C., meanwhile most of the terminals 22 continuously aligned at the positions from the 2-pin to the 8-pin in the second electrode 20 had a maximum temperature of 115° C. or higher, especially the terminal 22 disposed at a position of the 5-pin had a temperature of approximately 117° C., which was the highest.

In contrast, in the semiconductor device 1 according to the present embodiment, although the maximum temperature of the third electrode 30 disposed at a position of the 5-pin illustrated in the temperature distribution diagram G was approximately 54° C., the maximum temperature of each of the terminals 22 was successfully made lower by approximately 1.5° C. to approximately 3° C. than that in the semiconductor device for the comparative test.

As described above, the semiconductor device 1 according to the present embodiment includes: the second electrode 20 including the terminals 22 and the single slit 24 formed between adjacent two out of the terminals 22; the semiconductor chip 14 including the first face 14*b* connected to the first electrode 10 via the joining material 102 and the second face 14*a* being opposite the first face 14*b* and connected to the second electrode 20 via the joining material 145; and the third electrode 30 connected to the second face 14*a* via the joining material 306 inside the slit 24 provided in the second electrode 20. Therefore, when the semiconductor device 1 is operated, heat generation in the second electrode 20 serving as the source connector can be substantially prevented by the third electrode 30 serving as the gate connector having a smaller amount of heat generated. In other words, the heat generation can be dispersed on the semiconductor device 1. Thus, it is possible to lower the maximum temperature of the second electrode 20 during operation. Furthermore, for example, as in the case of the present embodiment, when the joining material 126 such as solder is used for the joining of the terminals 22 of the second electrode 20 to the first lead frames 12, the occurrence of cracks or the like in the joining material 126 can be substantially prevented. That is, by preventing the occurrence of a failure caused by heat generation during operation in the long-term use of the semiconductor device 1, the operating life of the semiconductor device 1 can be increased, whereby the long-term reliability of the semiconductor device 1 is enhanced.

In the semiconductor device 1 according to the present embodiment, as illustrated in FIG. 1, the number of the terminals 22 of the second electrode 20 is odd, for example, seven, and the slit 24 is formed between adjacent two out of the terminals 22 and is positioned adjacent to the central 4-pin terminal 22 out of the aligned terminals 22. Furthermore, the number of the terminals 22 separated from the slit 24 in one direction (the −Y direction) of the alignment direction of the terminals 22 is three, which is less by one than the number of the terminals 22, namely four, separated from the slit 24 in another direction (the +Y direction) opposite to the one direction. Thus, the slit 24 and the third electrode 30 disposed inside the slit 24 are positioned adjacent to the central terminal 22 in the alignment direction out of the terminals 22, whereby heat generation during operation of the semiconductor device 1 can be more uniformly dispersed on the semiconductor device 1.

Note that, for example, as illustrated in FIG. 4, also in the case where the number of the terminals 22 of the second electrode 20 is even, for example, six, and the slit 24 is formed between the terminals 22 adjacent to each other and is disposed at the center in the alignment direction (the Y-axis direction) of the terminals 22, and the number of terminals 22 separated from the slit 24 in one direction of the alignment direction and the number of the terminals 22 separated from the slit 24 in another direction opposite to the one direction are the same, that is, three, the third electrode 30 disposed inside the slit 24 is positioned at the center in the alignment direction of the terminals 22, whereby heat generation during operation of the semiconductor device 1 can be more uniformly dispersed on the semiconductor device 1.

In the semiconductor device 1 according to the present embodiment, for example, the second electrode 20 includes the plate base 21, the terminals 22 are formed so as to extend outside the plate base 21 from the edge 214 of the plate base 21, and the slit 24 is formed, for example, by cutting off a piece out of the plate base 21 so as to extend inside the plate base 21 from the edge 214 of the plate base 21 between the terminals 22 adjacent to each other, whereby a stress on the second electrode 20 can be dispersed on the terminal 22 side during joining to the first lead frame 12 in the reflow process or the like, for example, and thus, as in the present embodiment, when the joining material 126 such as solder is used for the joining of the terminals 22 to the first lead frames 12, the terminals 22 and the first lead frames 12 are more appropriately joined together by the joining material 126 such as solder.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:

a first electrode;

a second electrode including a plurality of terminals, and one slit formed between adjacent two out of the plurality of terminals;

a semiconductor chip including a first face connected to the first electrode via a joining material, and a second face being opposite the first face and connected to the second electrode via a joining material; and a third electrode connected to the second face via a joining material, inside the slit provided in the second electrode.

2. The semiconductor device according to claim 1, wherein the semiconductor chip includes:

a drain electrode formed in the first face and connected to the first electrode via the joining material;

a source electrode formed in the second face and connected to the second electrode via the joining material; and a gate electrode formed in the second face and connected to the third electrode via the joining material.

3. The semiconductor device according to claim 1, wherein a number of the plurality of terminals of the second electrode is even, the slit is formed between the adjacent two out of the terminals and positioned at a center in an alignment direction of the terminals, and a number of the terminals separated from the slit in one direction of the alignment direction is equal to a number of the terminals separated from the slit in a direction opposite to the one direction.

4. The semiconductor device according to claim 1, wherein a number of the plurality of terminals of the second electrode is odd, the slit is formed between the adjacent two out of the terminals and positioned adjacent to a central terminal out of the plurality of terminals aligned, and a number of the terminals separated from the slit in one direction of an alignment direction of the terminals is less by one than a number of the terminals separated from the slit in a direction opposite to the one direction.

5. The semiconductor device according to claim 1, wherein the second electrode includes a plate base, the plurality of terminals are formed to extend outside the plate base from an edge of the plate base, and the slit is formed to extend inside the plate base from the edge of the plate base between the adjacent two out of the plurality of terminals.

* * * * *